United States Patent [19]

Akamatsu et al.

[11] Patent Number: 5,251,177
[45] Date of Patent: Oct. 5, 1993

[54] SEMICONDUCTOR MEMORY DEVICE HAVING AN IMPROVED REFRESH OPERATION

[75] Inventors: Hironori Akamatsu, Moriguchi; Akinori Shibayama, Neyagawa; Hisakazu Kotani, Takarazuka; Junko Matsushima, Kashihara, all of Japan

[73] Assignee: Matsushita Electric Industrial Co., Ltd., Osaka, Japan

[21] Appl. No.: 799,925

[22] Filed: Nov. 26, 1991

Related U.S. Application Data

[63] Continuation of Ser. No. 468,438, Jan. 22, 1990, abandoned.

[30] Foreign Application Priority Data

Jan. 23, 1989 [JP] Japan .................................. 1-013818

[51] Int. Cl.$^5$ .......................... G11C 7/00; G11C 13/00
[52] U.S. Cl. .................................. 365/222; 365/230.03
[58] Field of Search ................. 365/222, 233, 189.05, 365/189.01, 230.03

[56] References Cited

U.S. PATENT DOCUMENTS

| | | | |
|---|---|---|---|
| 4,084,154 | 4/1978 | Panigrahi | 365/222 |
| 4,172,282 | 10/1979 | Aichelmann, Jr. et al. | 365/222 X |
| 4,486,860 | 12/1984 | Takemae et al. | 365/230.03 X |
| 4,796,232 | 1/1989 | House | 365/222 |
| 4,811,302 | 3/1989 | Koishi | 365/222 |
| 4,829,484 | 5/1989 | Arimoto et al. | 365/222 |
| 4,879,692 | 11/1989 | Tokushige | 365/230.03 |
| 4,907,199 | 3/1990 | Dosaka et al. | 365/222 |
| 4,914,630 | 4/1990 | Fujishima et al. | 365/222 X |
| 4,934,826 | 6/1990 | Miyatake et al. | 365/189.01 X |
| 5,075,886 | 12/1991 | Isobe | 365/222 X |

OTHER PUBLICATIONS

M. Taniguchi et al, IEEE Journal of Solid-State Circuits vol. SC-16, No. 5, Oct. 1981, pp. 492-498.
K. Ohta et al, IEEE Journal of Solid-State Circuits vol. SC-21, No. 5, Oct. 1986, pp. 649-654.
T. Nakano et al, ISSCC 83/Friday, Feb. 25, 1983/Imperial Ballroom A/9:00 A.M.
Nikkei Electronics, May 18, 1987 (No. 421) pp. 147-162 (Two-page English translation of Abstract).
M. Yamada et al., A 64 Kbit MOS Dynamic RAM with Auto/Self Refresh Functions, pp. 62-69 (English translation of Abstract).
K. Ohta et al., Nikkei Electronics, Apr. 7, 1986, (No. 392) pp. 235-241 (English translation of Abstract).

Primary Examiner—Alyssa H. Bowler
Attorney, Agent, or Firm—Panitch Schwarze Jacobs & Nadel

[57] ABSTRACT

An improved arrangement for refreshing a semiconductor memory device comprising a plurality of memory blocks is disclosed. In the memory device, word lines of all memory blocks are commonly controlled by one controller. One of the memory blocks is selected to be subject to the write/read operation. The refresh is performed in the remaining memory blocks while the selected memory block is written or read. The period of time required for the refresh can be decreased.

4 Claims, 17 Drawing Sheets

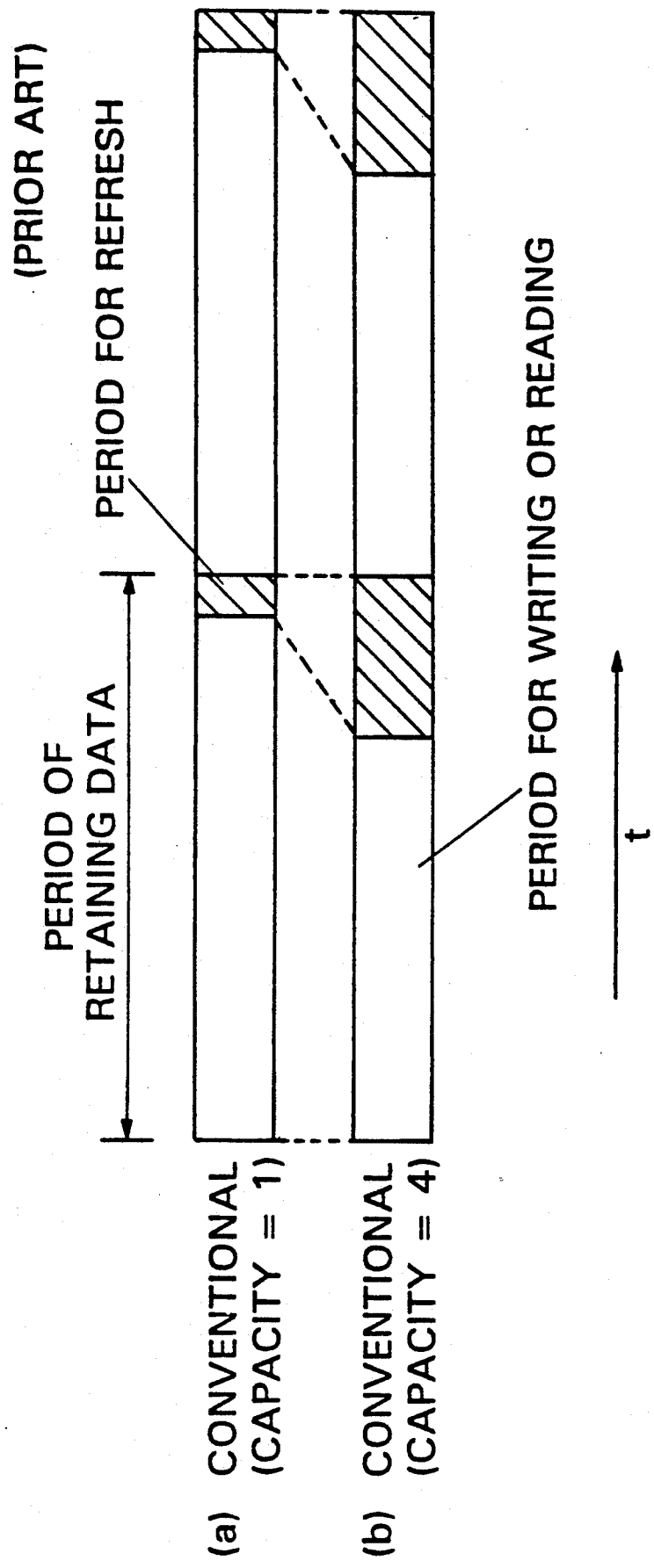

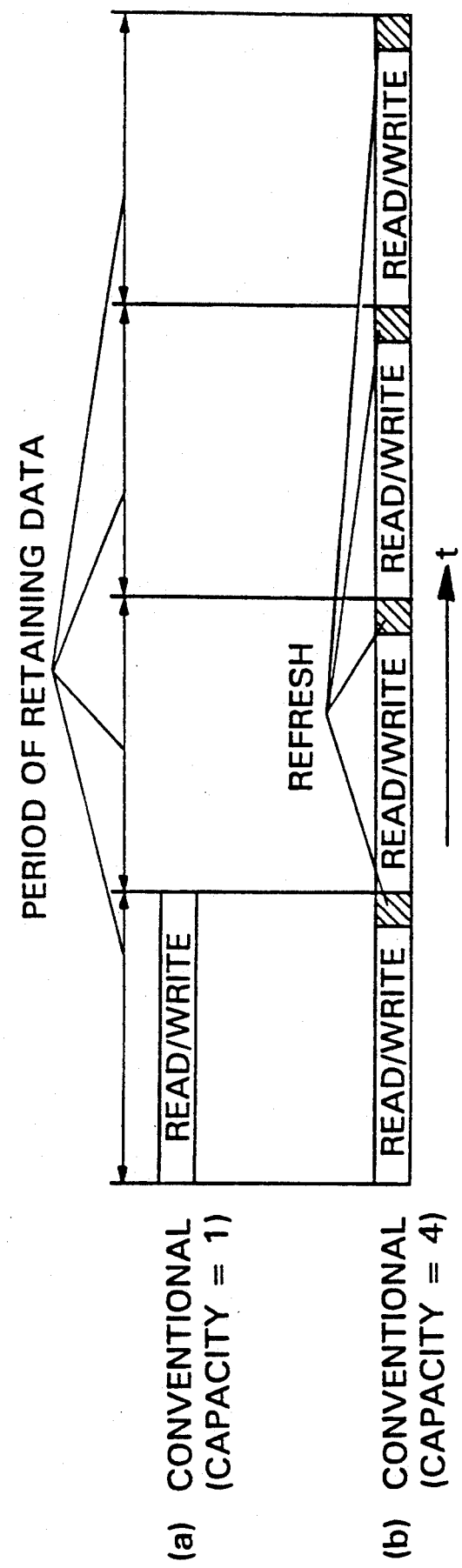

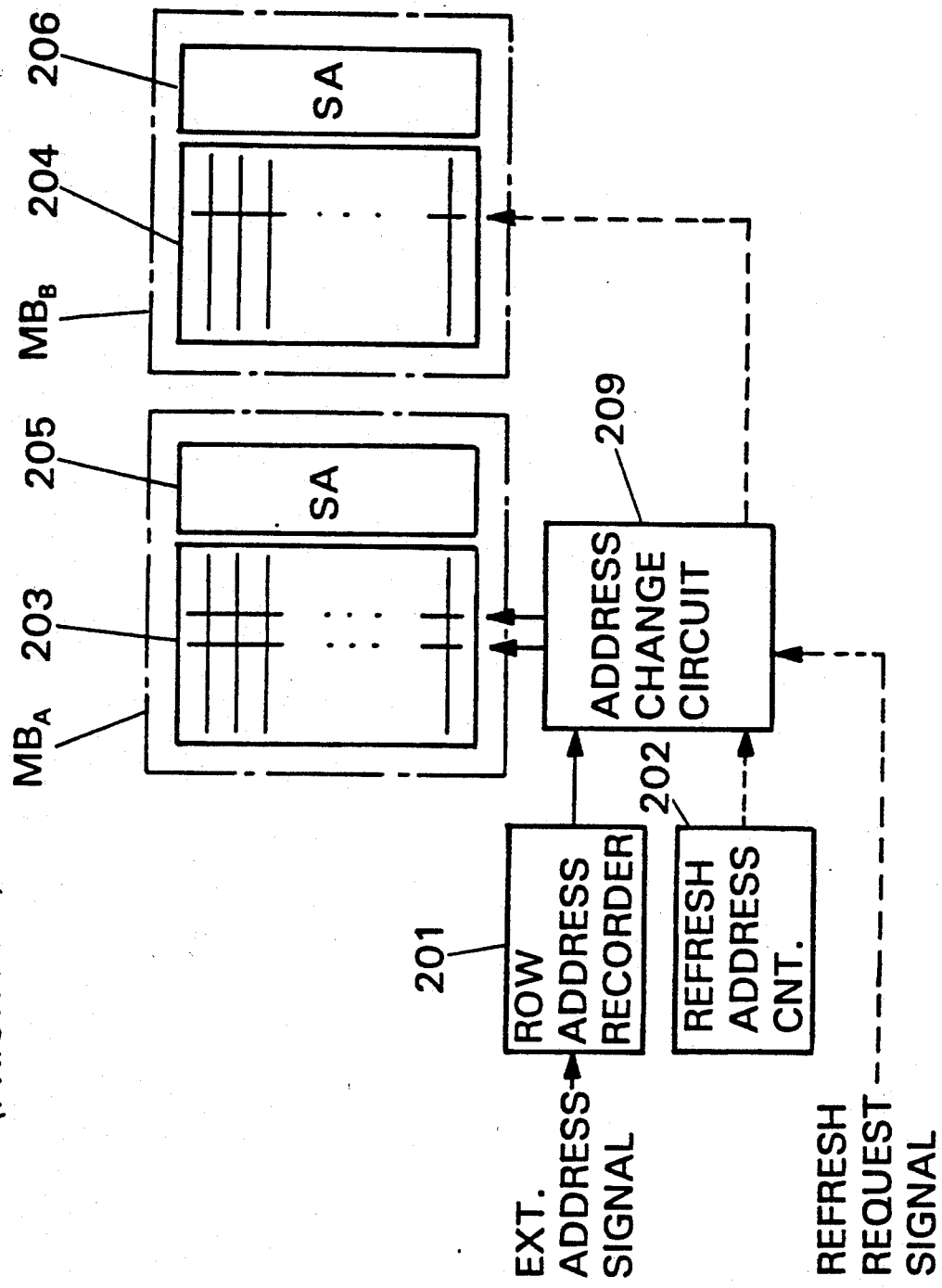

SEMICONDUCTOR MEMORY DEVICE HAVING AN IMPROVED REFRESH OPERATION

This is a continuation of application Ser. No. 07/468,438 filed Jan. 22, 1990 now abandoned.

BACKGROUND OF THE INVENTION

1. Field of the Invention

This invention relates to a semiconductor memory device, and more particularly to a semiconductor memory device in which the period of time required for refreshing can be reduced.

2. Description of the Prior Art

Currently, a dynamic RAM (hereinafter, abbreviated as "DRAM") is used as a semiconductor memory device with the greatest memory capacity, but its integration remains to be increased. In a DRAM, data are stored in memory cells using their capacitance. Because of this principle of holding data in memory cells, memory cells must be refreshed. Failure to refresh the memory cells results in the destruction of data stored in these cells. Further, the period of time for performing the refresh is prolonged with the advancement of the integration of a DRAM. Therefore, it has been demanded to shorten the period of time required for the refresh. Hereinafter, this period of time is referred to as "refresh overhead time".

The refresh operation in a memory cell will be described with reference to FIGS. 13 and 14. In FIG. 14, shown are a memory cell MA, a sense amplifier SA, a word line W, a pair of bit lines b and /b, and a sense amplifier control circuit PLC. When the word line W is activated, data stored in the memory cell MA is read out to the pair of bit lines b and /b, and the sense amplifier SA is activated so that the read out data is amplified. Then, the amplified data is written back into the memory cell MA, thereby completing the refresh. In this way, the refresh is performed for each memory cell MA connected to the word line W, and therefore the length of the refresh overhead time depends on the number of word lines.

Referring to FIGS. 15-18, the refresh operation in a conventional semiconductor memory device will be described in more detail. The memory device shown in FIG. 15 comprises an input/output unit I/O, a pair of data lines D and /D, a memory block MB, a row decoder control circuit ROC, a column decoder control circuit COC, a row decoder control line RA, a column decoder control line CA, and a control line for a sense amplifier power source control circuit PLCL. The internal structure of the DRAM is illustrated in more detail in FIG. 16. In FIG. 16, CO is a column decoder, ROW is a row decoder, PLC is a sense amplifier power source control circuit, $SA_1$-$SA_n$ are sense amplifiers, $SW_1$-$SW_n$ are switching elements, $SWC_1$-$SWC_n$ are switching element control lines, $b_1$-$b_n$ and $/b_1$-$/b_n$ are bit line pairs, $PL_1$ is a first sense amplifier power source line, $PL_2$ is a second sense amplifier power source line, and $W_1$-$W_n$ are word lines.

In the DRAM shown in FIGS. 15 and 16, the refresh is performed sequentially from the memory cell MA connected to the word line $W_1$ to the one connected to the word line $W_n$, in a predetermined unit of time, so that data are continuously rewritten in the memory cells. When the level of integration of a DRAM becomes higher, however, the refresh overhead time becomes longer, resulting in a shortening of the period of time for reading and writing data. More specifically, when comparing two memory devices one of which is greater in storage capacity by four times than the other, the refresh overhead time in the greater memory device ((b) of FIG. 17) is four times as long than the refresh overhead time ((a) of FIG. 17) in the smaller memory device. In a special type of DRAM such as a video memory, particularly, data in all memory cells must be sequentially read out and written, and, therefore, it is not possible to access all memory cells during the time when memory cells can retain their data, resulting in that the refresh times must be provided as shown in (b) of FIG. 18. If a DRAM has a small storage capacity, it is not necessary to provide such a refresh overhead time ((a) of FIG. 18).

As the level of integration of a DRAM becomes higher, the number of memory cells increases so that the refresh overhead time which is useless for the reading or writing operation is prolonged. To alleviate this problem, the number of refresh times is reduced in a highly integrated DRAM. This can be realized by improving the performance of memory cells, i.e., by lengthening the data hold time of the memory cells. In view of the recent strides in integration, however, further improvement of the performance of memory cells is nearly impossible. Hence, it is necessary to shorten the refresh overhead time.

In a DRAM, usually, memory cells are divided into several blocks as shown in FIG. 19. The DRAM of FIG. 19 comprises a row address decoder 201 for decoding an external address signal, a refresh address counter 202 for generating a refresh address, an address change circuit 209; and memory blocks $MB_A$ and $MB_B$. The memory block $MB_A$ includes a memory cell unit 203 and sense amplifiers 205. The other memory block $MB_B$ includes a memory cell unit 204 and sense amplifiers 206. The address change circuit 209 changes an external address signal and an internal refresh address in accordance with a refresh request signal which is supplied when the refresh is to be performed.

The row address decoder 201 decodes an external address signal, and a write/read address is input to the address change circuit 209. The refresh address counter 202 generates an internal refresh address signal which is then supplied to the address change circuit 209. According to a refresh request signal, the address change circuit 209 changes the write/read address and the internal refresh address. In a write/read cycle, the address change circuit 209 outputs only a write/read address. This causes the corresponding word line in one memory block to be activated, and the potential change is amplified by a sense amplifier to write or read a memory cell. When the word line of the memory block $MB_A$ is activated and the write or read is done in the memory block $MB_A$, the word line of the address of the other memory block $MB_B$ is not activated and the refresh of the address is not performed. When the refresh is to be performed, the refresh address counter 202 outputs the internal refresh address through the address change circuit 209. Then, the word lines of both the memory blocks $MB_A$ and $MB_B$ are simultaneously activated, and the potential changes on the word lines are amplified to refresh the memory cells of the address. After the refresh of the memory cells connected to one word line in both the memory blocks $MB_A$ and $MB_B$ is completed, the refresh address of the refresh address counter 202 is changed, and the refresh of the memory cells of the new refresh address is performed. In this way, all memory cells in the memory blocks MB$_A$ and MB$_B$ are sequentially refreshed.

When a memory block of a conventional DRAM is written or read, the refresh of a row address of other memory blocks in the DRAM cannot be performed. Therefore, the refresh overhead time is required for all word lines to refresh memory cells connected thereto, resulting in that the period of time for writing and reading is reduced.

SUMMARY OF THE INVENTION

The semiconductor memory device of this invention, which overcomes the above-discussed and numerous other disadvantages and deficiencies of the prior art, comprises a plurality of memory blocks, said memory blocks comprising: memory cells arranged in a matrix form; pairs of bit lines for selecting column addresses of said memory cells; word lines for selecting row addresses of said memory cells; sense amplifiers; and a sense amplifier control circuit for controlling said sense amplifiers, and further comprises: a control means for commonly controlling said word lines of all of said memory blocks; a selection means for selecting one or more blocks of said memory blocks to be subjected to the write and/or read operation; a first process means for performing the write and/or read operation in said selected memory blocks; and a second process means for performing the refresh operation in the unselected memory blocks.

In a preferred embodiment, the sense amplifier control circuit comprises a first portion for writing or reading, and a second portion for refreshing, said first portion being used in the write and/or read operation, and said second portion being used in the refresh operation.

The semiconductor memory device of this invention comprises, a plurality of memory blocks, said memory blocks comprising: memory cells arranged in a matrix form; pairs of bit lines for selecting column addresses of said memory cells; word lines for selecting row addresses of said memory cells; sense amplifiers; and a sense amplifier control circuit for controlling said sense amplifiers, and further comprises: a control means for commonly controlling said word lines of all of said memory blocks; and a process means for simultaneously performing the refresh operation in all of said memory blocks.

In a preferred embodiment, the sense amplifier control circuit comprises a first portion for writing or reading, and a second portion for refreshing, said first portion being used in the write and/or read operation, and said second portion being used in the refresh operation.

The semiconductor memory device of this invention comprises a plurality of memory blocks, said memory blocks comprising memory cells arranged in a matrix form, and further comprises: a selection means for selecting one or more blocks of said memory blocks to be subjected to the write and/or read operation; a process means for performing the write and/or read operation in said selected memory blocks; a refresh means for performing the refresh operation in the unselected memory blocks within the period of time of said write and/or read operation; a memory means for storing addresses of memory cells in said memory blocks, said memory cells being refreshed in said period of time of said write and/or read operation; another selection means for selecting memory cells which are not refreshed in said period of time of said write and/or read operation, on the basis of said stored addresses; and another refresh means for refreshing said selected memory cells within a period of time designated for refreshing.

In a preferred embodiment, the memory device further comprises a signal means for generating a signal which indicates that all of said selected memory cells have been refreshed up to the end of said period of time.

Thus, the invention described herein makes possible the objectives of (1) providing a semiconductor memory device in which the refresh overhead time is reduced; (2) providing a semiconductor memory device in which the refresh overhead time is not required; (3) providing a semiconductor memory device in which the period of time for writing or reading can be prolonged; and (4) providing a semiconductor memory device in which the increase of a current level can be suppressed.

BRIEF DESCRIPTION OF THE DRAWINGS

This invention may be better understood and its numerous objects and advantages will become apparent to those skilled in the art by reference to the accompanying drawings as follows:

FIGS. 17($a$-$b$) are diagrams illustrating a refresh overhead time in conventional DRAMs.

FIGS. 18($a$-$b$) are diagrams illustrating the timing of the refresh in a conventional video memory.

FIG. 19 is a block diagram showing a conventional DRAM.

DESCRIPTION OF THE PREFERRED EMBODIMENTS

Example 1

Figure 1:
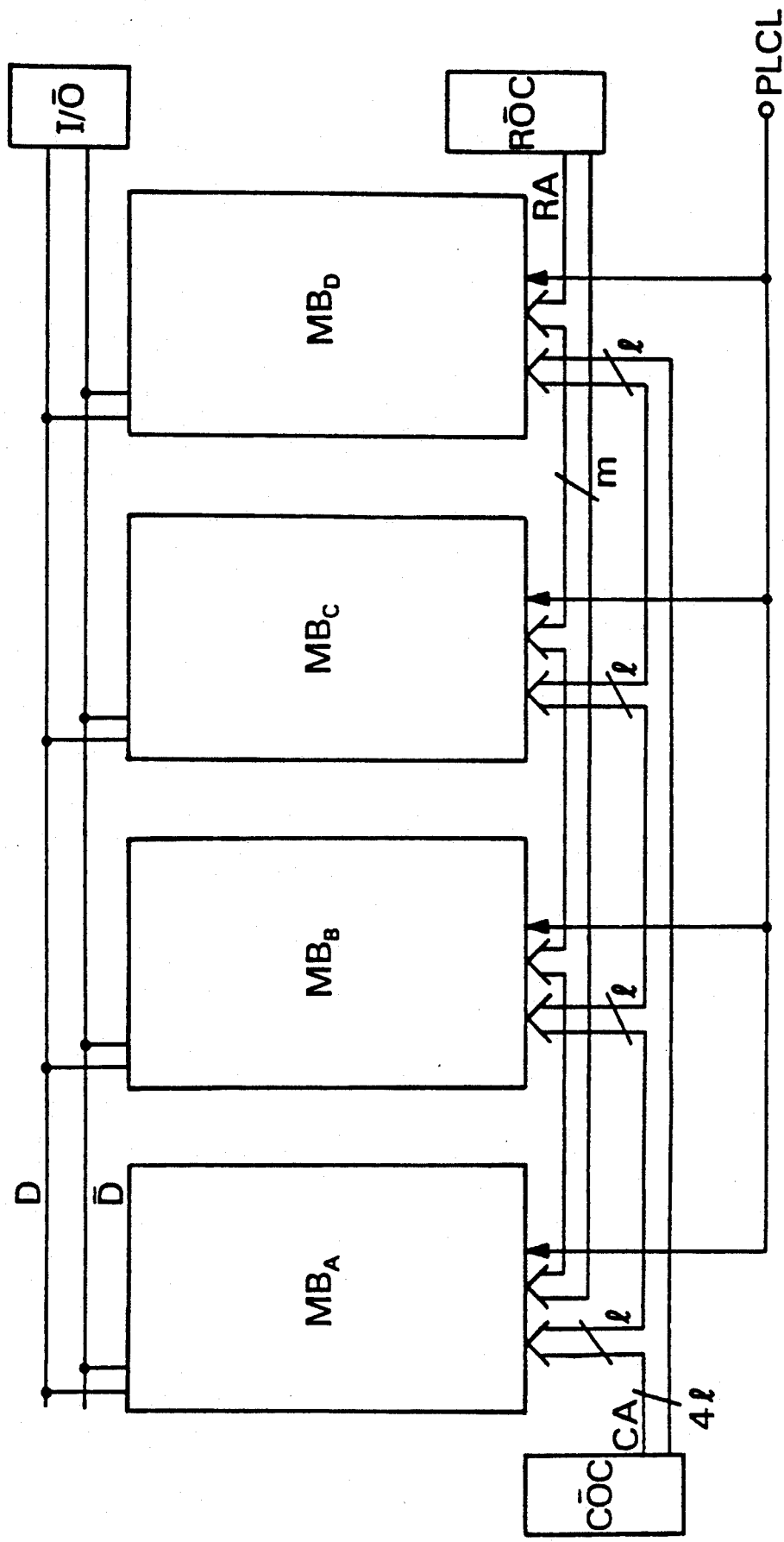
FIG. 1 is a block diagram showing a first embodiment of the semiconductor memory device according to the invention.

With reference to FIGS. 1-5, the first embodiment of the invention will be described. This embodiment is a semiconductor memory device which is useful as a video memory. The outline of the memory device is shown in FIG. 1. The memory device of FIG. 1 comprises an input/output unit I/O, a pair of data lines D and /D, four memory blocks $MB_A$-$MB_D$, a row decoder control circuit ROC, a column decoder control circuit COC, a row address bus RA, column address bus CA, and a control line for a sense amplifier power source control circuit PLCL. To each of the memory blocks $MB_A$-$MB_D$ connected are one control line of the column address bus CA, m number of the control lines of the row address bus RA common to each block, and the control line PLCL. The column address bus CA includes 41 control lines in total. The column address bus CA conveys the output of the column decoder control circuit COC, and the row address bus RA conveys the output of the row decoder control circuit ROC. The memory blocks $MB_A$-$MB_D$ are also connected to the input/output unit I/O through the pair of data lines D and /D.

Figure 2:
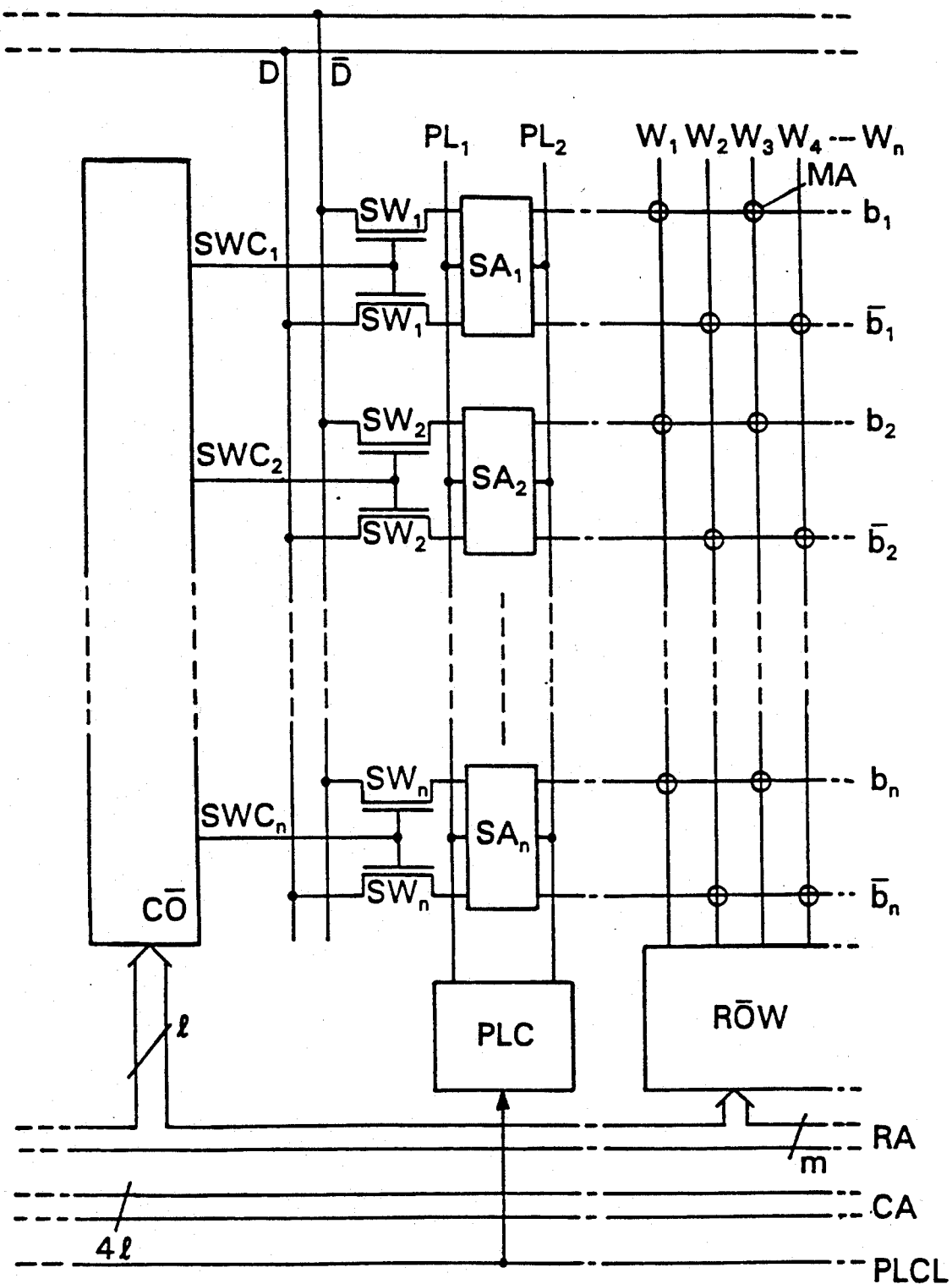
FIG. 2 is a block diagram showing a memory block of the memory device of FIG. 1.

The memory blocks $MB_A$-$MB_D$ have a structure as shown in FIG. 2, and comprise a column decoder CO, a row decoder ROW, a sense amplifier power source control circuit PLC, sense amplifiers $SA_1$-$SA_n$, switching elements $SW_1$-$SW_n$, switching element control lines $SWC_1$-$SWC_n$, bit line pairs $b_1$-$b_n$ and $b_1$-/$b_n$, word lines $W_1$-$W_n$, a first power source line $PL_1$, and a second power source line $PL_2$. The bit line pairs $b_1$-$b_n$ and /$b_1$-/$b_n$ are arranged so as to perpendicularly intersect with the word lines $W_1$-$W_n$. At the intersections, memory cells MA are disposed. The row decoder ROW controls the word lines $W_1$-$W_n$, and selects one of the word lines $W_1$-$W_n$. The bit line pairs $b_1$-$b_n$ and /$b_1$-/$b_n$ are coupled to the inputs of the sense amplifiers $SA_1$-$SA_n$. The outputs of the sense amplifiers $SA_1$-$SA_n$ are connected to the pair of data lines D and /D via the switching elements $SW_1$-$SW_n$ which are controlled by outputs $SWC_1$-$SWC_n$ of the column decoder CO. The control circuit PLC controls the sense amplifiers $SA_1$-$SA_n$ through the first and second power source lines $PL_1$ and $PL_2$.

Figure 3:
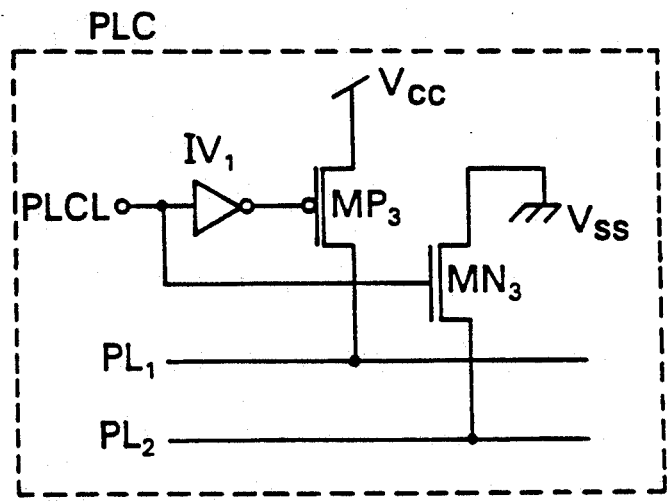
FIG. 3 is a circuit diagram of a sense amplifier power source control circuit used in the memory device of FIG. 1.
Figure 4:
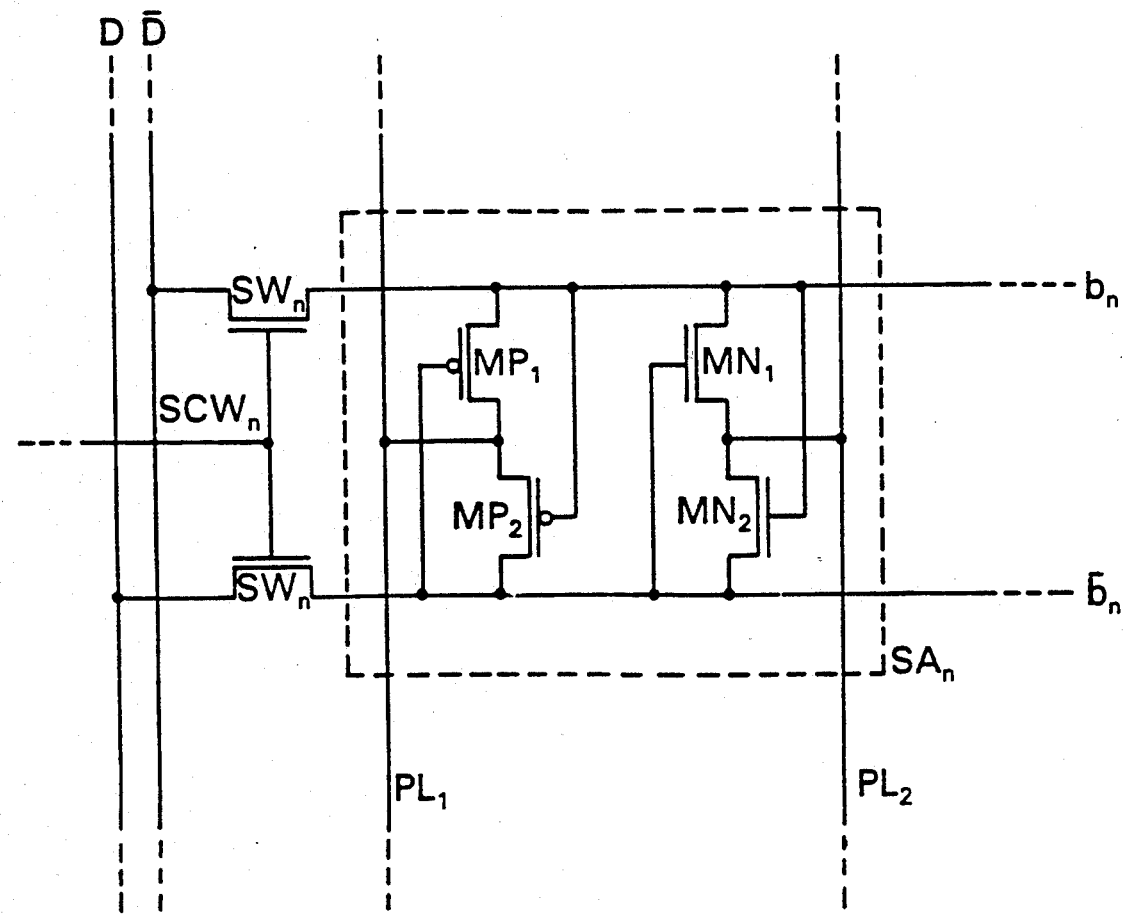
FIG. 4 is a circuit diagram of a sense amplifier used in the memory device of FIG. 1.

FIG. 3 shows the sense amplifier power source control circuit PLC. When the state of a signal line PLCL for the control circuit PLC becomes HIGH, MOS transistors $MP_3$ and $MN_3$ are turned ON, and power is supplied to the power source lines $PL_1$ and $PL_2$. In FIG. 3, $IV_1$ is an inverter. The sense amplifiers $SA_1$-$SA_n$ have the structure shown in FIG. 4, and comprise four MOS transistors $MP_1$, $MP_2$, $MN_1$ and $MN_2$. When the power source lines $PL_1$ and $PL_2$ are energized, the sense amplifiers $SA_1$-$SA_n$ are activated to sense data which are read out to the bit line pairs $b_1$-$b_n$ and /$b_1$-/$b_n$.

Figure 5:
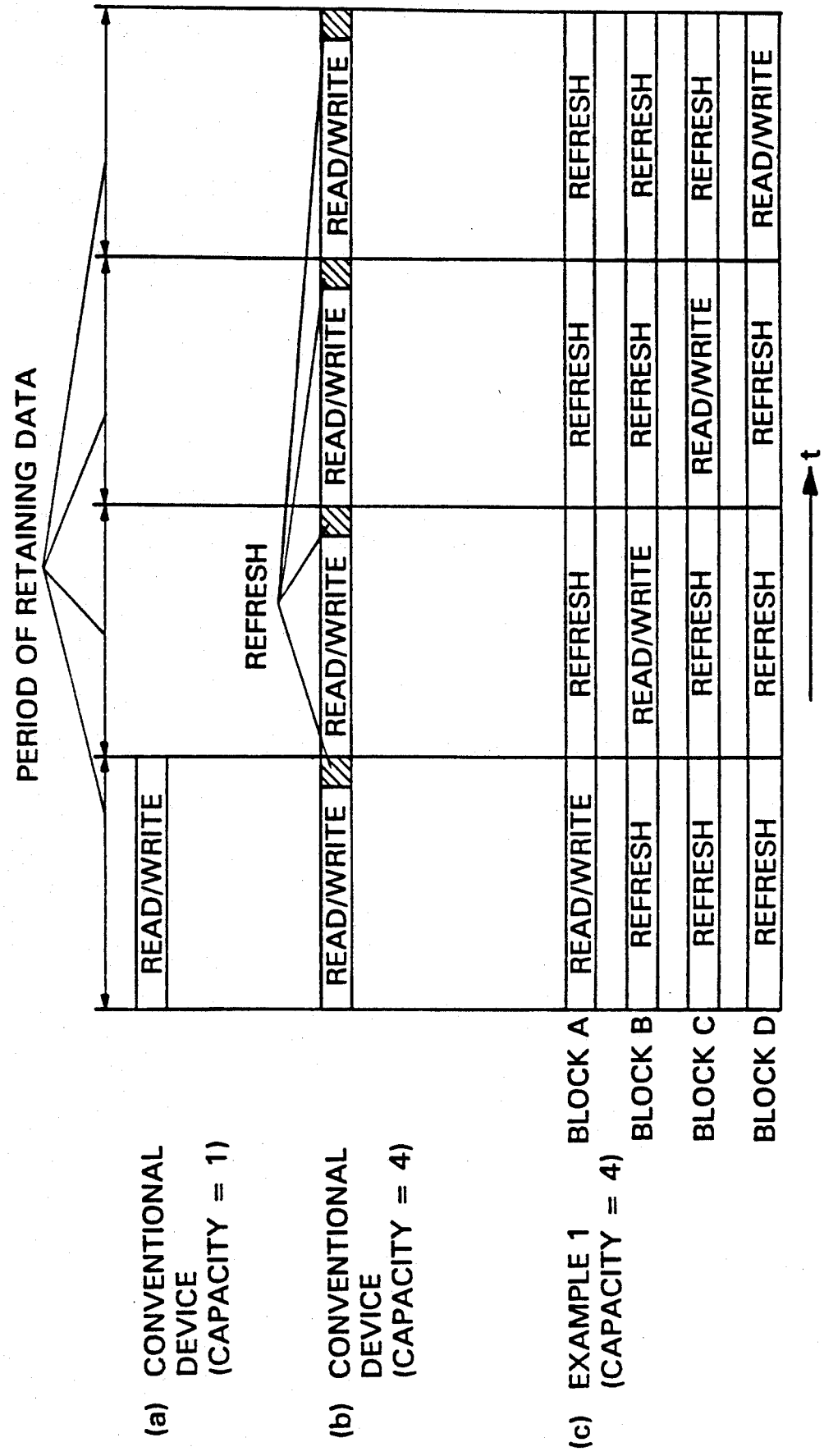
FIGS. 5($a$-$c$) are diagrams showing the timing in a conventional memory device and the memory device of FIG. 1.

The operation of the memory device of FIG. 1 will be described. As mentioned above, the memory device of FIG. 1 is a vidoe memory in which data stored in all memory cells are sequentially accessed to be written or read out. For example, the memory block $MB_A$ is selected to be written or read out, and the remaining memory blocks $MB_B$-$MB_D$ to be refreshed. Since the signal on the row address bus RA and the control signal line PLCL are common to all the memory blocks $MB_A$-$MB_D$, the row decoders ROW and the power source control circuits PLC of the memory blocks $MB_A$-$MB_D$ are commonly controlled, and, in all the memory blocks $MB_A$-$MB_D$ a word line $W_m$ having an address common to the memory blocks is selected. When the sense amplifiers $SA_1$-$SA_n$ are activated, data stored in the memory cells connected to the word line $W_m$ in the memory blocks $MB_A$-$MB_D$ are read out to the the bit line pairs $b_1$-$b_n$ and /$b_1$-/$b_n$, and sensed and amplified. Among the amplified data, the data of the memory block $MB_A$ only is transferred to the pair of data lines D and /D through the switching elements $SW_1$-$SW_n$, and the data of the remaining memory blocks $MB_B$-$MB_D$ are rewritten respectively in the original memory cells (i.e., the refresh of the memory blocks $MB_B$-$MB_D$ is performed). In this way, the refresh of the memory blocks $MB_B$-$MB_D$ is automatically performed while writing and reading the memory block $MB_A$. This is schematically illustrated in (c) of FIG. 5. In FIG. 5, (a) shows the timing in a conventional memory device having a small storage capacity, and (b) the timing in another conventional memory device having a large storage capacity (four times that of the small DRAM of (a)). As shown in FIG. 5, in a conventional large memory device of (b), refresh overhead time is required. In contrast, according to this embodiment, data can be rewritten without providing the refresh overhead time. According to the invention, it is not necessary to provide refresh overhead time even if the storage capacity or number of memory blocks is increased.

Example 2

Figure 6:
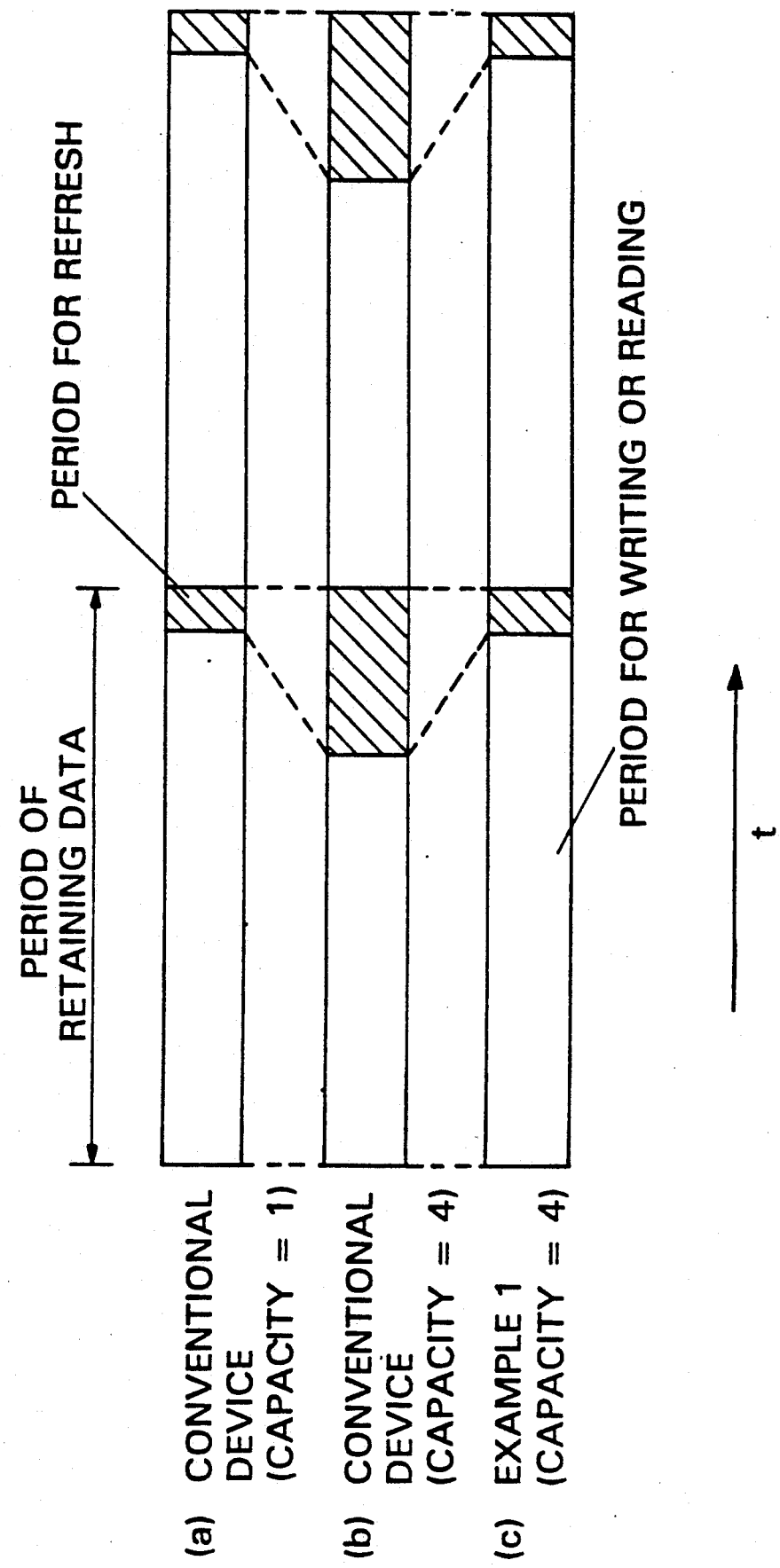
FIGS. 6($a$-$c$) are diagrams showing the write/read time and refresh overhead time in a second embodiment and a conventional memory device.

This embodiment is a DRAM having a configuration which is similar to that of the embodiment of FIG. 1, but is designed so that all the memory blocks $MB_A$-$MB_D$ are refreshed simultaneously. In this configuration, therefore, the refresh is performed against four word lines in a bundle. This means that the apparent number of the word lines is reduced to one-fourth. Even if the DRAM of the embodiment has a fourfold storage capacity as compared with a conventional small DRAM ((a) of FIG. 6), therefore, the refresh overhead time in this embodiment ((c) of FIG. 6) is not increased as it is in a conventional large DRAM ((b) of FIG. 6), resulting in that it is not necessary to decrease the write/read time in a unit of time nor to reduce the number of the refresh operations. Consequently, conditions such as the retention time which must be considered in the design of a DRAM can be made less severe. In other words, according to this embodiment, the refresh overhead time can be shortened with the increase of the number of memory blocks, and the following expression can be held:

$$\text{Time for refresh} = \frac{\text{Total of word lines}}{\text{Number of blocks}} \times$$

(time for refresh per one word line)

Example 3

Figure 7:
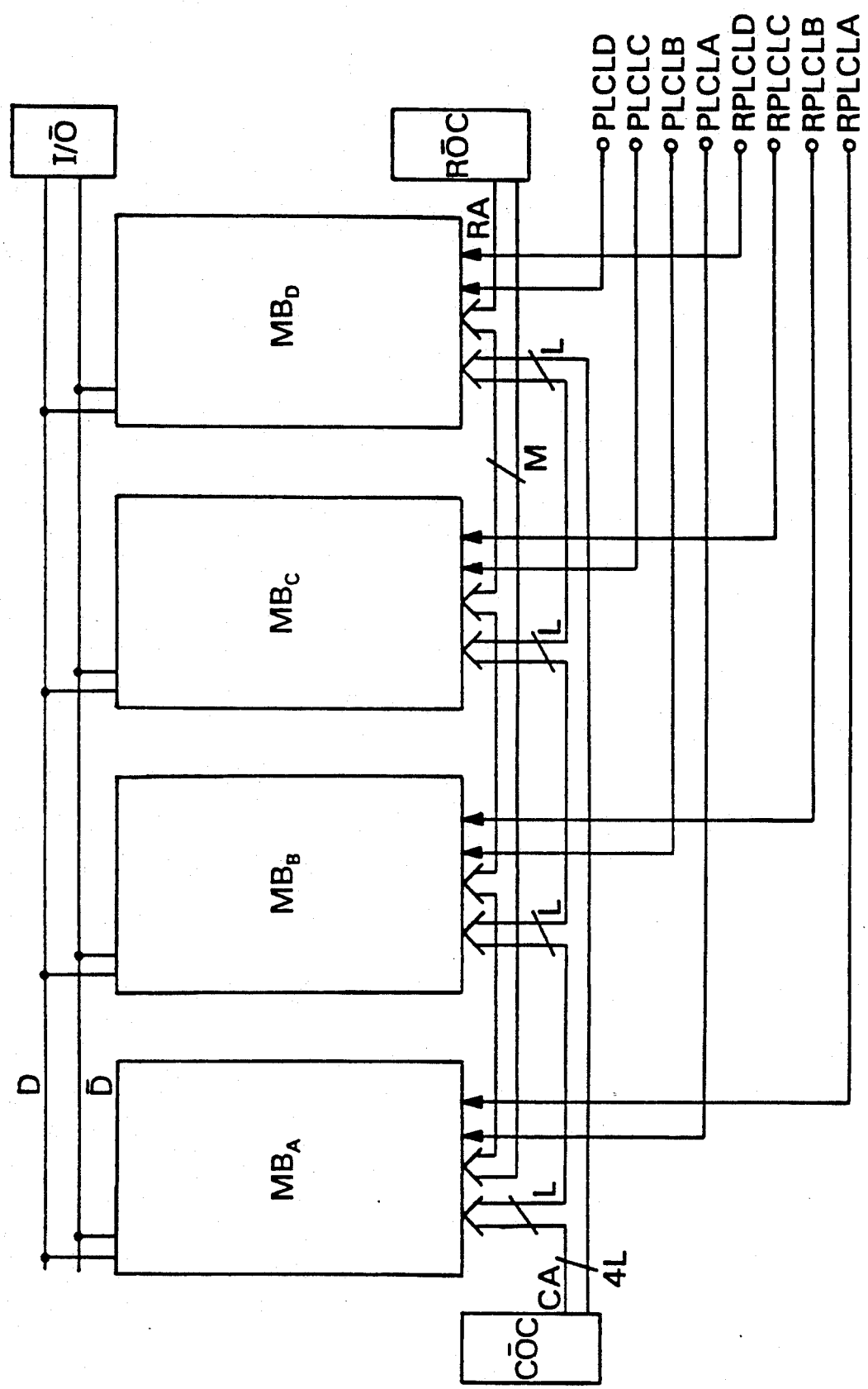
FIG. 7 is a block diagram showing a third embodiment of the semiconductor memory device according to the invention.
Figure 10:
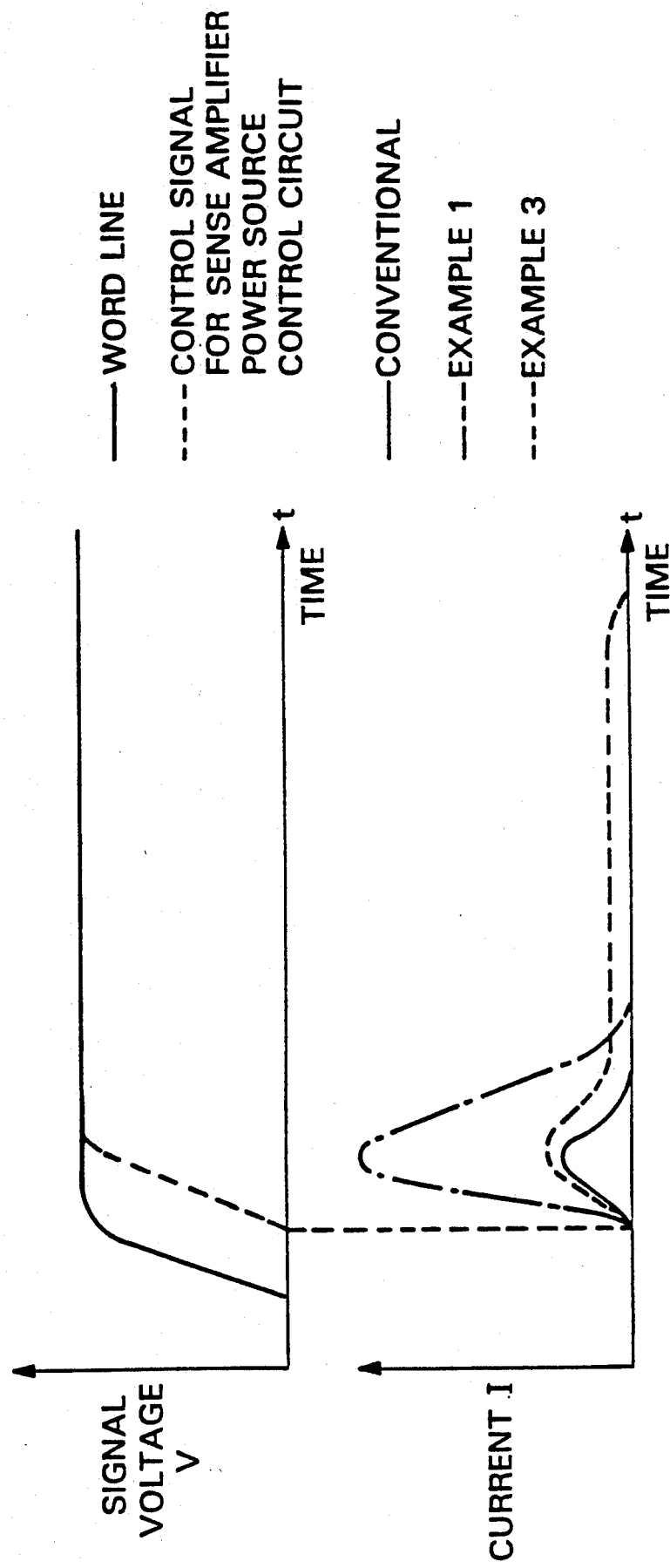
FIG. 10 is a graph illustrating the amount of current flowing through a conventional memory device, and the first and third embodiments.

FIG. 7 illustrates the third embodiment of this invention. In the above-mentioned construction of the first embodiment, all of the four memory blocks are activated simultaneously, that is, one word line and sense amplifiers in each memory block are driven, so that, as shown in FIG. 10, the current is increased fourfold as compared with a conventional memory device. The increased current is a problem in itself, and may cause a malfunction due to the voltage drop of the power source line, and the reduction of the performance margin, and further adversely affects the design of a power source circuit such as a down converter. The embodiment of FIG. 7 can eliminate these problems.

Figure 9:
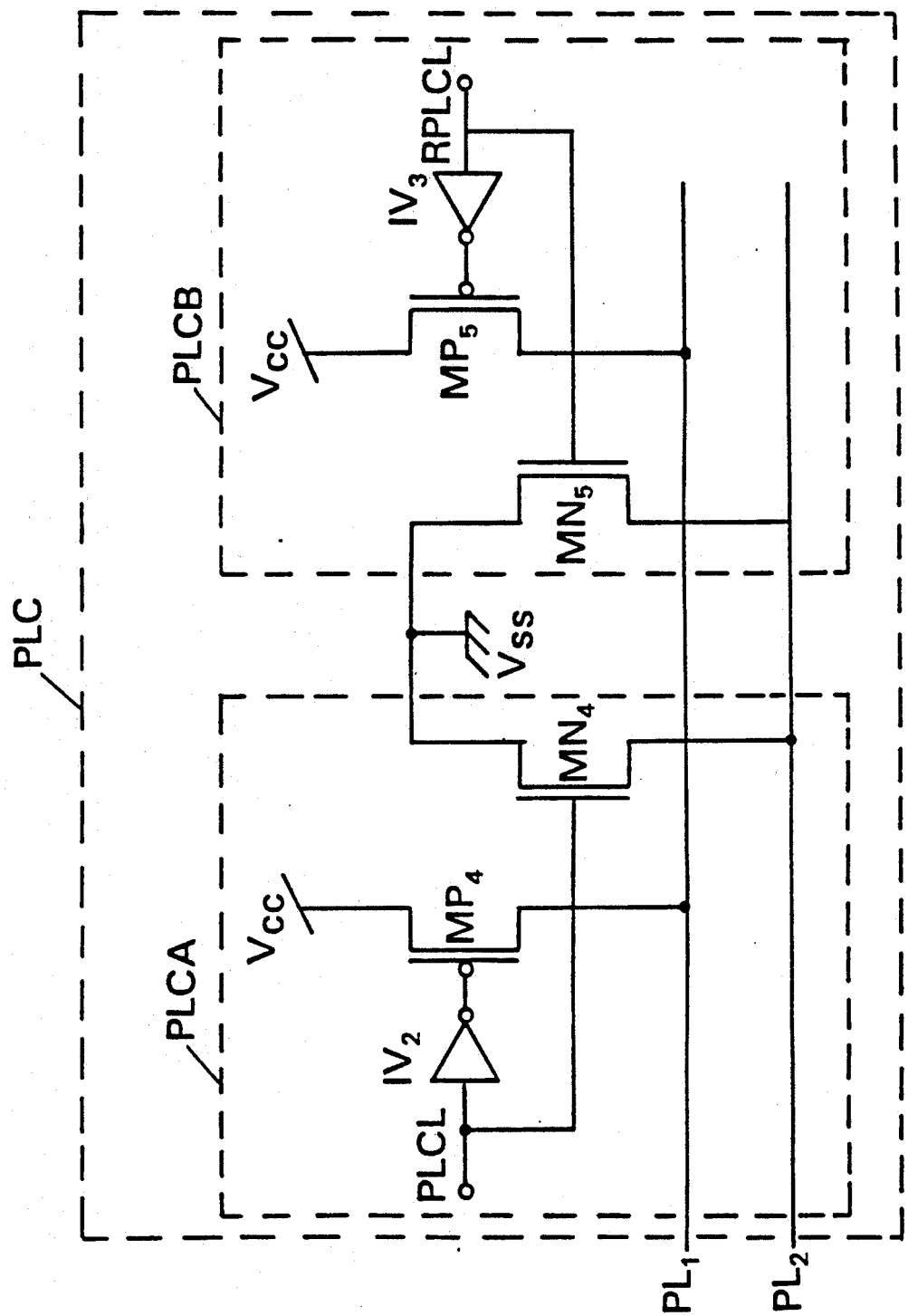
FIG. 9 is a circuit diagram of a sense amplifier power source control circuit used in the memory device of FIG. 7.

In the memory device of FIG. 7, control lines $PLCL_A$-$PLCL_D$ are respectively connected to the sense amplifier power source control circuits PLC of the memory blocks $MB_A$-$MB_D$, and refresh control lines $RPLCL_A$-$RPLCL_D$ for sense amplifier power source control circuits PLC are further provided. As shown in FIG. 9, each of the sense amplifier power source control circuits PLC is divided into a write/read portion PLCA connected to one of the control lines $PLCL_A$-$PLCL_D$ and a refresh portion PLCB connected to one of the refresh control lines $RPLCL_A$-$RPLCL_D$. The write/read portion PLCA comprises a P-channel MOS transistor $MP_4$, an N-channel MOS transistor $MN_4$, and an inverter $IV_2$. The refresh portion PLCB comprises a P-channel MOS transistor $MP_5$, an N-channel MOS transistor $MN_5$, and an inverter $IV_3$.

Figure 8:
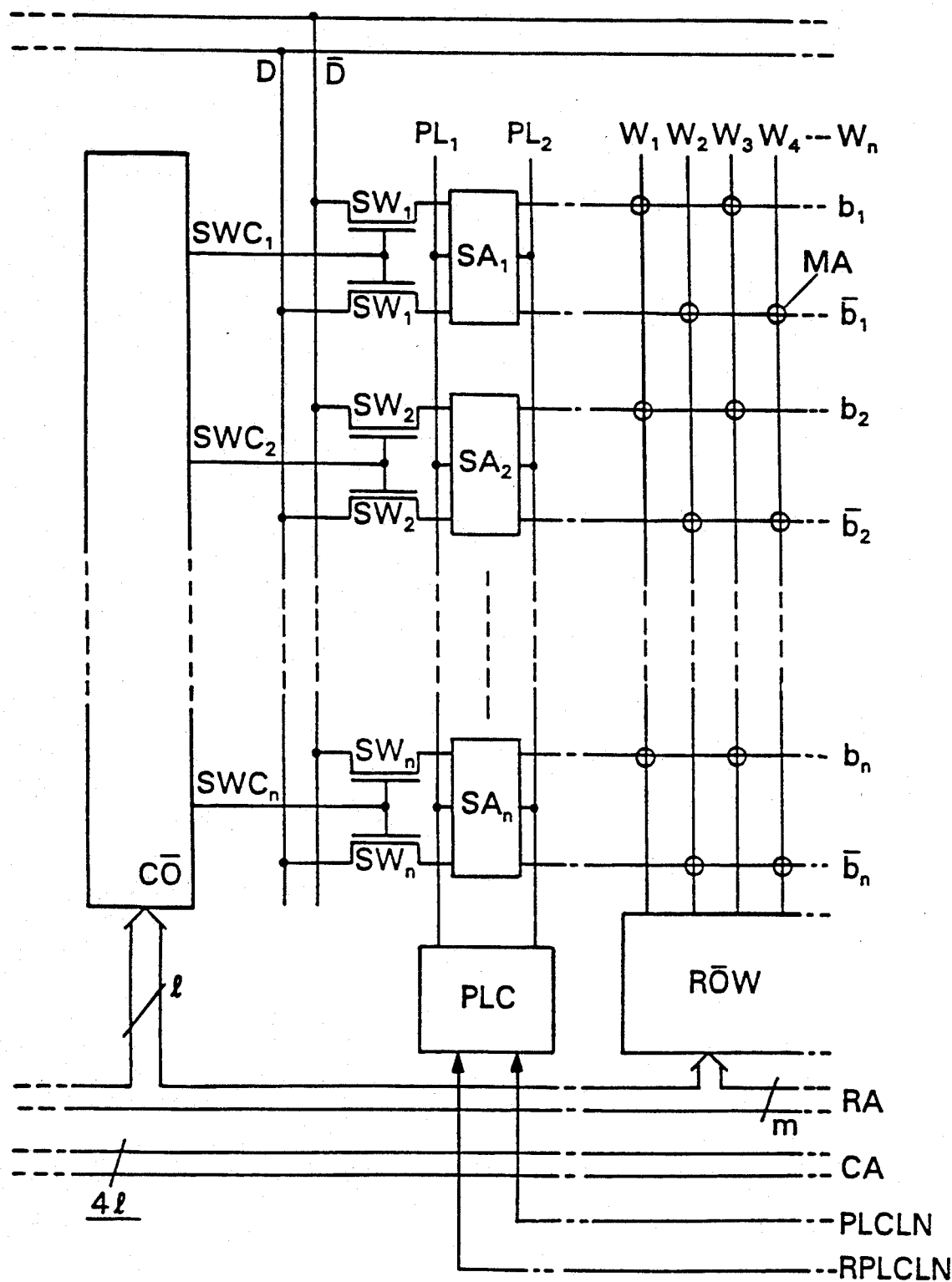
FIG. 8 is a block diagram showing a memory block of the memory device of FIG. 7.

The operation of the memory device of FIG. 7 will be described by illustrating a case when the memory device is used as a video memory in which memory cells are sequentially accessed. For example, the memory block $MB_A$ is selected to be written or read out, and the remaining memory blocks $MB_B$-$MB_D$ to be refreshed. In the memory block $MB_A$, the write/read portion PLCA is used, and, in the memory blocks $MB_B$-$MB_D$, the refresh portions PLCB are used. As shown in FIG. 8, one word line $W_n$ is connected to many memory cells MA. In the memory block $MB_A$, memory cells MA connected to one word line $W_n$ are sequentially accessed, and therefore a sufficient time is required to access all memory cells MA connected to one word line $W_n$. By contrast, the refresh is simultaneously performed on memory cells MA connected to one word line $W_n$. In the memory blocks $MB_B$-$MB_D$, hence, it is possible to slowly perform the refresh while memory cells MA of the memory block $MB_A$ are sequentially accessed, enabling the sense amplifier power source control circuits PLC to be designed in a small size. Consequently, the current or power consumed in this embodiment can be reduced as compared with the memory device of FIG. 1, as shown in FIG. 10.

In the sense amplifier power source control circuits PLC, the transistors $MP_5$ and $MN_5$ of the refresh portion PLCB are designed so as to occupy a relatively small size as compared with the transistors $MP_4$ and $MN_4$ of the write/read portion PLCA, thereby suppressing the current flowing in the refresh. Since the load capacitance caused by the pair of data lines D and /D, etc. connected to the sense amplifiers $SA_1$-$SA_n$ must be charged by the sense amplifiers within a unit of time, it is required to construct the transistors $MP_4$ and $MN_4$ of the write/read portion PLCA in a somewhat large size.

As described above, according to the embodiment, the power consumption can be suppressed even if a plurality of memory blocks are simultaneously refreshed.

Example 4

Figure 11:
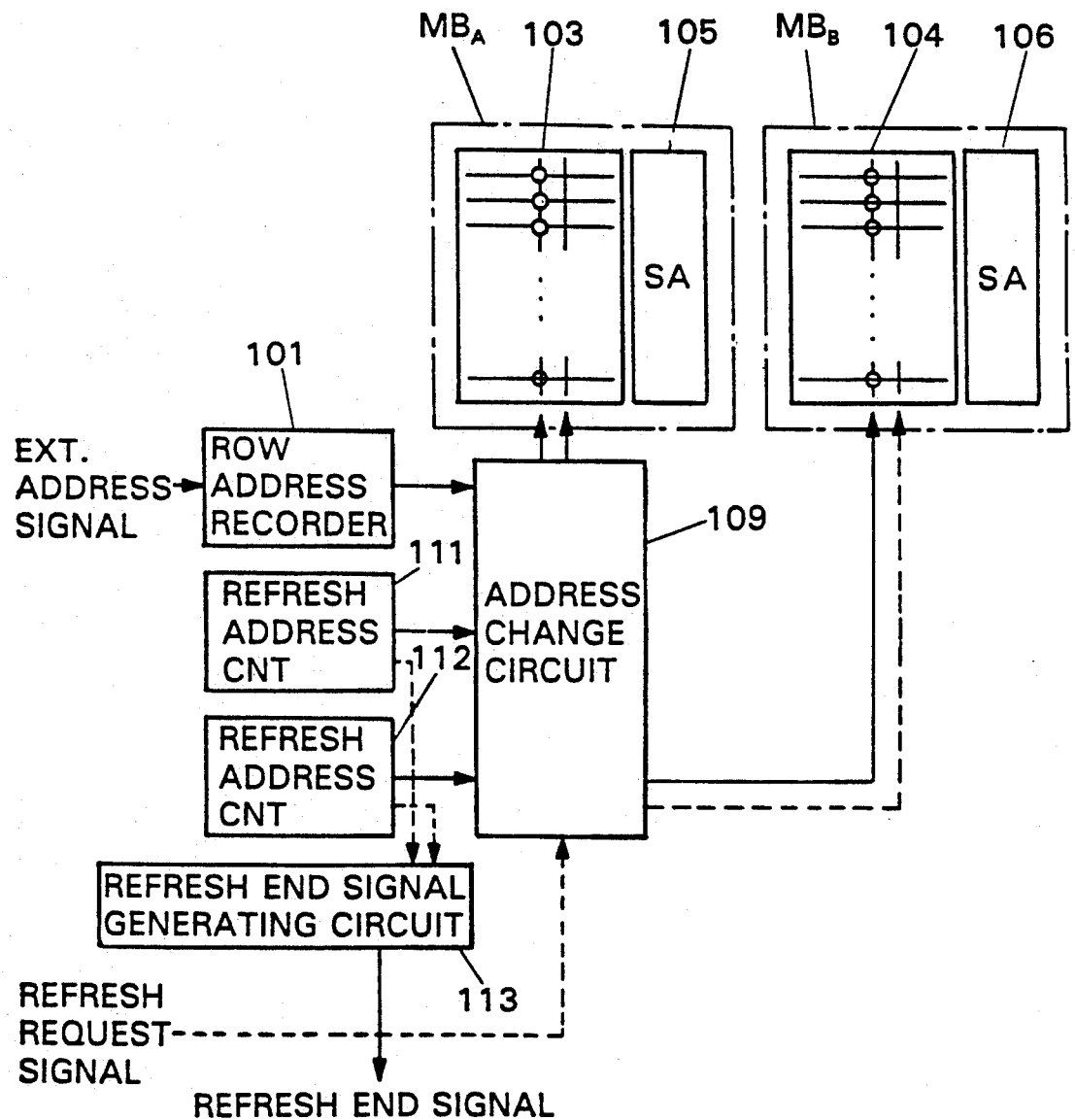
FIG. 11 is a block diagram showing a fourth embodiment of the semiconductor memory device according to the invention.

FIG. 11 shows a DRAM according to the invention. The DRAM of FIG. 11 comprises two memory blocks $MB_A$ and $MB_B$, and further comprises: a row address decoder 101 for decoding an external address signal, a first refresh address counter 111 for generating an internal refresh address for the memory block $MB_A$; a second refresh address counter 112 for generating an internal refresh address for the memory block $MB_B$; and an address change circuit 109. The memory block $MB_A$ includes a memory cell unit 103 and sense amplifiers 105. The other memory block $MB_B$ includes a memory cell unit 104 and sense amplifiers 106. The address change circuit 109 changes an external address signal and an internal refresh address in accordance with a refresh request signal which is supplied when the refresh is to be performed. 113 is a refresh end signal generating circuit which outputs a refresh end signal indicating the completion of refresh of all blocks, in accordance with a signal from the refresh address counters 111 and 112.

The refresh operation in the DRAM of FIG. 11 will be described. When data is to be written or read out from the memory block $MB_A$, the row decoder 101 decodes an external address signal, and the decoded external address signal is supplied to the address change circuit 109. The address change circuit 109 outputs a write or read address to activate the corresponding word line in the memory block $MB_A$, and the writing or reading is performed in the memory block $MB_A$. At the same time, the refresh address counter 112 outputs internal refresh addresses in a predetermined sequence to the memory block $MB_B$, through the address change circuit 109. The refresh is conducted sequentially in the memory block $MB_B$, while the writing or reading is performed in the memory block $MB_A$. On the other hand, when data is to be written or read out from the memory block $MB_B$, the row decoder 101 decodes an external address signal, and the decoded external address signal is supplied to the address change circuit 109. The address change circuit 109 outputs a write or read address to activate the corresponding word line in the memory block $MB_B$, and the writing or reading is performed in the memory block $MB_B$. At the same time, the refresh address counter 112 outputs internal refresh addresses in a predetermined sequence to the memory block $MB_A$, through the address change circuit 109. The refresh is conducted sequentially in the memory block $MB_A$, while the writing or reading is performed in the memory block $MB_A$.

According to this embodiment, one memory block is refreshed while conducting the writing or reading of another memory block, and each of the refresh address counters 111 and 112 stores addresses of the corresponding memory block which have been subjected to the refresh. In accordance with the addresses stored in each refresh address counter, memory cells which have not been refreshed in the writing or reading operation are refreshed in the refresh overhead time. Since it is not necessary to refresh all memory cells during the refresh overhead time, the length of the refresh overhead time can be reduced.

Figure 12:
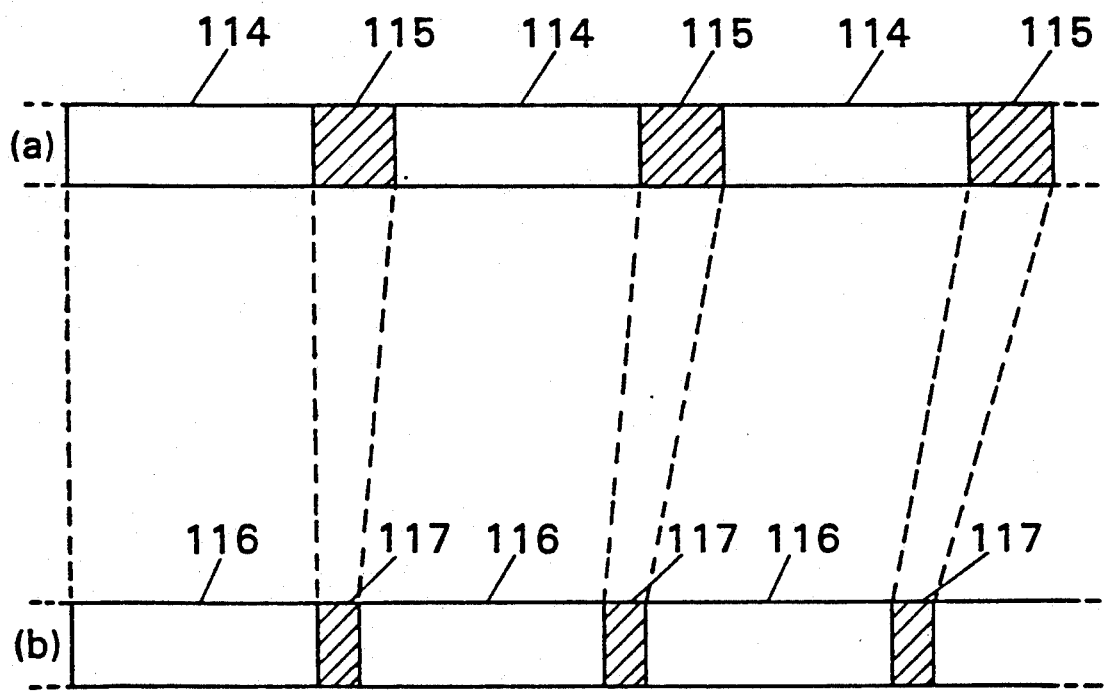
FIG. 12 is a diagram illustrating the timing in a conventional memory device and in the fourth embodiment.
Figure 13:
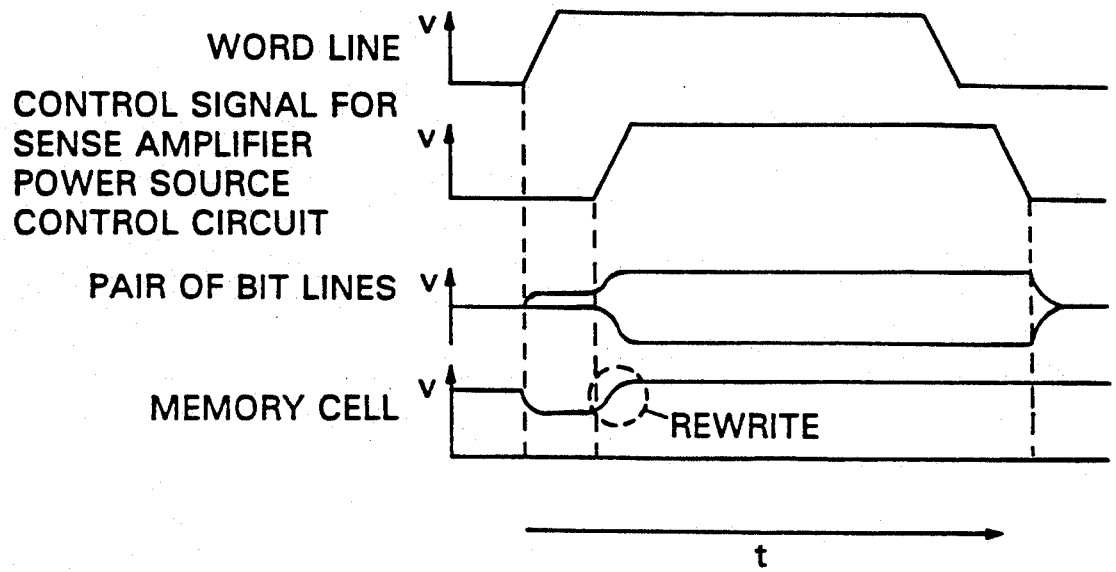
FIG. 13 is a timing chart of the refresh operation.
Figure 14:
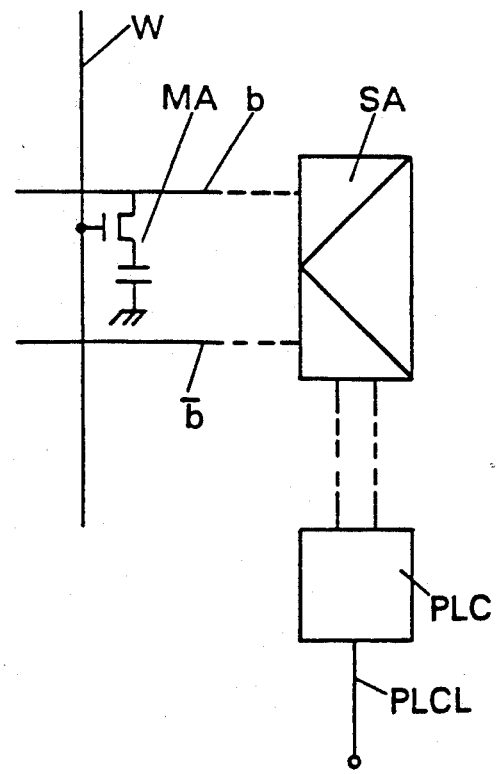
FIG. 14 is a circuit diagram showing a memory cell in a DRAM.
Figure 15:
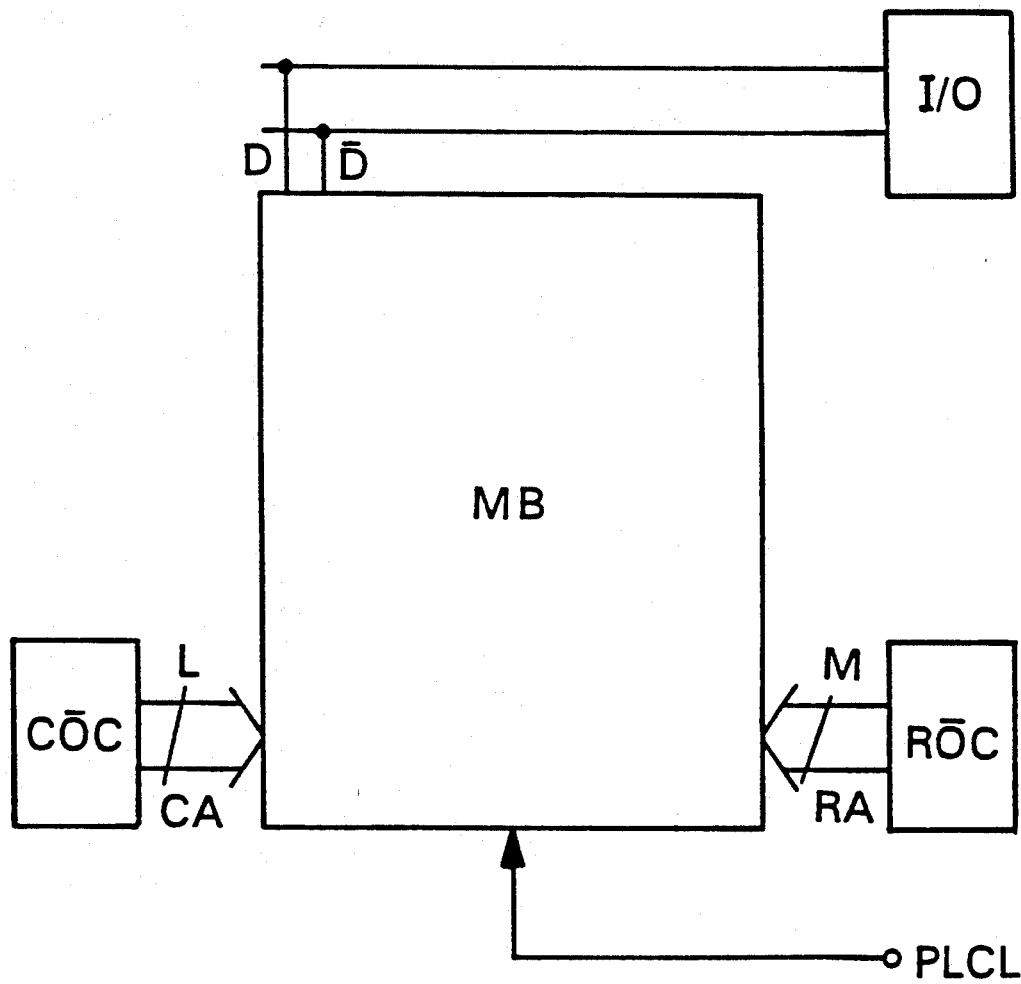
FIG. 15 is a block diagram of a conventional DRAM.
Figure 16:
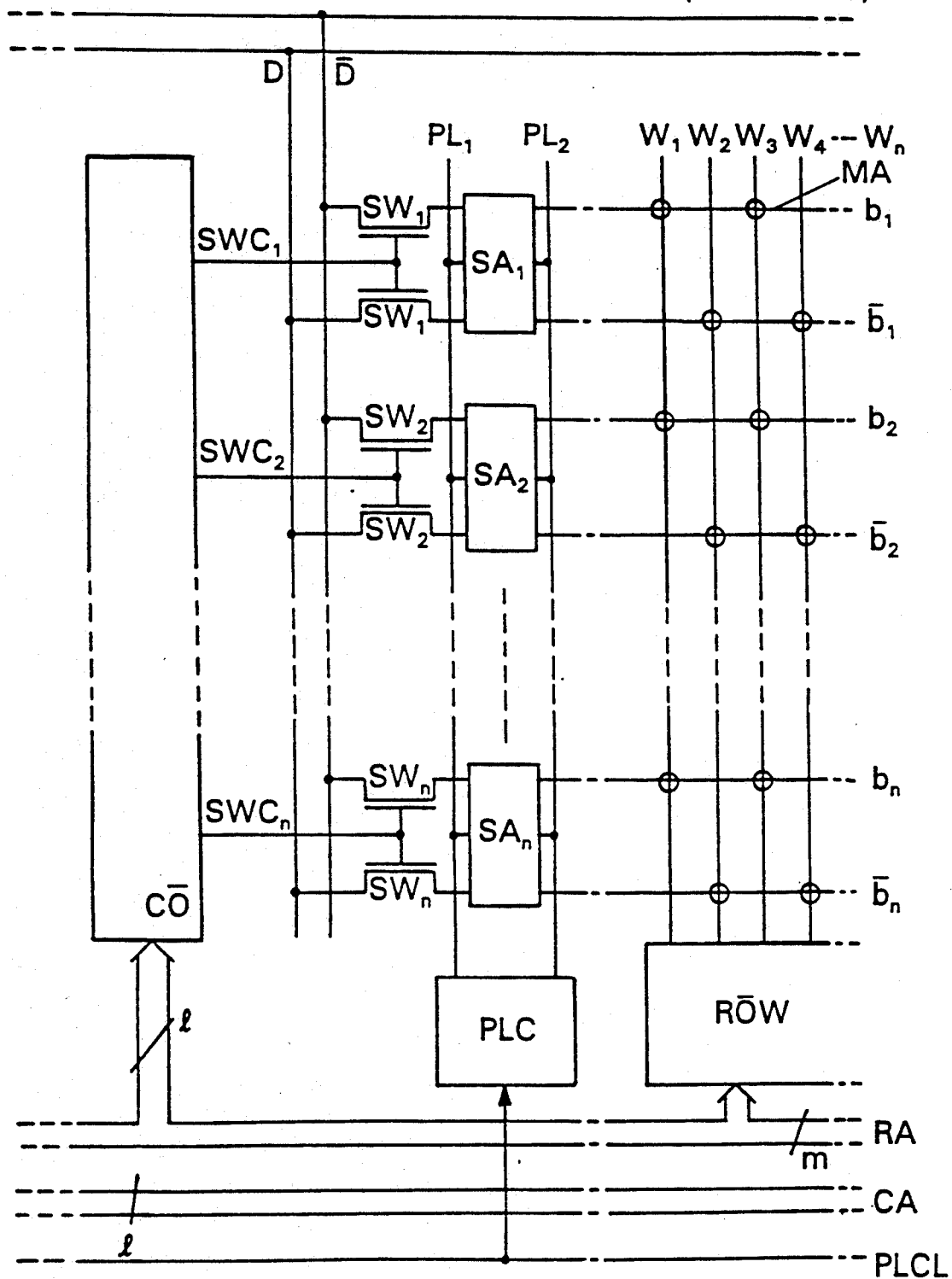
FIG. 16 is a block diagram showing a memory block of the conventional DRAM of FIG. 15.

In FIG. 12, (a) shows the refresh overhead time in a conventional DRAM, and (b) the refresh over head time in this embodiment. Numerals 114 and 116 indicate the period of time for writing or reading, and numerals 115 and 117 the refresh overhead time, in the conventional DRAM and this embodiment, respectively. As shown in (a) of FIG. 12, the refresh in the conventional DRAM is conducted for all memory cells during the refresh overhead time 115, and therefore the length of the refresh overhead time 115 is constant and relatively long. In contrast, according to this embodiment, it is not necessary to refresh all memory cells during the refresh overhead time 117. Hence, the length of the refresh overhead time 117 is not constant, and is shorter than the refresh overhead time 115 of the conventional DRAM. According to this embodiment, consequently, the length of the period of time for writing and reading can be increased.

When the refresh for all memory cells in a memory block has been completed within a refresh overhead time period, the refresh address counter 111 or 112 corresponding to the memory block outputs a memory block refresh end signal indicative of the completion of the refresh of all memory cells of the memory block, to the refresh end signal generating circuit 113. After receiving the memory block refresh end signals from all of the refresh address counters (i.e., 111 and 112), the refresh end signal generating circuit 113 generates a refresh end signal which indicates that all memory cells have been refreshed. This refresh end signal is supplied to the outside of the chip through a pin, so that an external device such as a CPU can detect the completion of the refresh, thereby enabling the process to transfer smoothly and without loss of time to the write/read operation.

The embodiment of FIG. 11 is provided with two memory blocks, but in the invention the number of memory blocks can be freely selected.

According to the embodiment, memory cells of one or more memory blocks which are not selected to be written or read are refreshed in synchronism with the writing or reading of memory cells of other memory blocks which are selected to be written or read, thereby shortening the refresh overhead time. When the refresh overhead time is not zero, the addresses of the memory cells which have been refreshed in a write/read time are stored. Then, memory cells of other memory blocks which have not been refreshed in said write/read time are refreshed, using the stored address of memory cells, thereby reducing the refresh overhead time. In other words, the period of time when the write/read operation is disabled can be shortened so that the usage efficiency of a DRAM is effectively improved.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor memory device comprising a plurality of memory blocks, said memory blocks comprising: memory cells arranged in a matrix form; pairs of bit lines for selecting column addresses of said memory cells; word lines for selecting row addresses of said memory cells; sense amplifiers; and a sense amplifier control circuit for controlling said sense amplifiers;
    said semiconductor memory device further comprises:
        a control means for controlling said word lines of all said memory blocks;
        a selection means for selecting one or more blocks of said memory blocks to be subjected to a write and/or read operation;
        a first process means for performing the write and/or read operation in said selected memory blocks; and
        a second process means for performing the refresh operation in the unselected memory blocks, when said first process means is operated,
    said sense amplifier control circuit comprises a first portion for writing or reading, and a second portion for refreshing, said first portion being used in the write and/or read operation, and said second portion being used in the refresh operation, the level of a current for driving said second portion being smaller than the level of a current for driving said first portion.

2. In a semiconductor memory device comprising a plurality of memory blocks, said memory blocks comprising: memory cells arranged in a matrix form; pairs of bit lines for selecting column addresses of said memory calls; word lines for selecting row addresses of said memory calls; sense amplifiers; and a sense amplifier control circuit for controlling said sense amplifiers,
    said semiconductor memory device further comprising:
        a control means for controlling said word lines of all said memory blocks;
        a selection means for selecting one or more blocks of said memory blocks to be subjected to a write and/or read operation;
        a first process means for performing the write and/or read operation in said selected memory blocks; and
        a second process means for simultaneously performing a refresh operation in all of said memory blocks,
    said sense amplifier control circuit comprises a first portion for writing or reading, and a second portion for refreshing, said first portion being used in the write and/or read operation, and said second portion being used in the refresh operation, the level of a current for driving said second portion being smaller than the level of a current for driving said first portion.

3. In a semiconductor memory device comprising a plurality of memory blocks, said memory blocks comprising memory cells arranged in a matrix form,
    said semiconductor memory device further comprises:
        a selection means for selecting one or more blocks of said memory blocks to be subjected to the write and/or read operation;
        a process means for performing the write and/or read operation in said selected memory blocks;
        a refresh means for performing the refresh operation in the unselected memory blocks within the period of time of said write and/or read operation;
        a memory means for storing addresses of memory cells in said memory blocks, said memory cells being refreshed in said period of time of said write and/or read operation;
        another selection means for selecting memory cells which are not refreshed in said period of time of said write and/or read operation, on the basis of addresses stored in said memory means; and
        another refresh means for refreshing said selected memory cells within a period of time designated for refreshing.

4. A semiconductor memory device according to claim 3 wherein said memory device further comprises a signal means for generating a signal which indicates that all of said selected memory cells have been refreshed up to the end of said period of time.

* * * * *